(12) United States Patent
Sunkavalli et al.

(10) Patent No.: US 7,176,717 B2
(45) Date of Patent: Feb. 13, 2007

(54) PROGRAMMABLE LOGIC AND ROUTING BLOCKS WITH DEDICATED LINES

(75) Inventors: Ravi Sunkavalli, Milpitas, CA (US);
Hare K. Verma, Cupertino, CA (US);
Chandra Mulpuri, San Jose, CA (US);
Elliott Delaye, San Jose, CA (US)

(73) Assignee: Velogix, Inc., Santa Clara, CA (US)

( * ) Notice: Subject to any disclaimer, the term of this patent is extended or adjusted under 35 U.S.C. 154(b) by 11 days.

(21) Appl. No.: 11/036,109

(22) Filed: Jan. 14, 2005

(65) Prior Publication Data
US 2006/0158219 A1 Jul. 20, 2006

(51) Int. Cl.
*H03K 19/177* (2006.01)
(52) U.S. Cl. .......................................... 326/41; 326/47
(58) Field of Classification Search ............ 326/37–41, 326/47
See application file for complete search history.

(56) References Cited

U.S. PATENT DOCUMENTS 6,335,634 B1 * 1/2002 Reddy et al. .................. 326/41
6,833,730 B1 * 12/2004 Ganesan et al. ............... 326/41
6,897,680 B2 * 5/2005 Schleicher et al. ........... 326/41

* cited by examiner

*Primary Examiner*—James H. Cho
(74) *Attorney, Agent, or Firm*—John Su; Haynes Beffed & Wolfeld LLP (57) ABSTRACT

A programmable logic structure is disclosed that has a set of dedicated lines which extend internally throughout different dedicated logic cells within a logic and routing block (LRB), extend from a previous logic routing block to the present logic and routing block, or extend from the present logic and routing block to the next logic and routing block. One set of dedicated lines from a first logic and routing block can be stitched to another set of dedicated lines of a second logic and routing block for extending the reach as well as bypassing a logic and routing block, or bypassing a dedicated logic cell in the same logic and routing block. The dedicated lines between logic and routing blocks allow a logic and routing block to receive more inputs from its own switch box or to drive more outputs than provided by the logic and routing block as specified by a given function.

15 Claims, 9 Drawing Sheets

PROGRAMMABLE LOGIC AND ROUTING BLOCKS WITH DEDICATED LINES

BACKGROUND OF THE INVENTION

1. Field of Invention

The present invention relates generally to integrated circuits (ICs) such as field programmable gate arrays (FPGAs), and more particularly to enhancing connections between functional blocks in programmable logic devices.

2. Description of Related Art

Field programmable gate arrays are often selected by design engineers to provide a flexible approach in programming and re-programming integrated circuits in order to accommodate a system specification, correct errors in the system, or make improvements to the system by reprogramming the FPGA. One conventional field programmable gate array architecture is implemented using groups of look-up tables and programmable interconnect circuits. While the look-up tables and sequential elements are connected to each other, the connections to the groups of look-up tables typically originate from a switch box located in each group of the look-up table. A hierarchical interconnect structure connects to elements in a look-up table through a switch box, thereby serving as the primary source of connecting look-up tables from one logic block to another logic block. The inputs to the look-up tables are therefore generated primarily from the switch box. The look-up table outputs are directly fed to other look-up tables as well as the elements within the look-up tables, but the connections inputs in other look-up tables are made through the switch box.

In another conventional structure, a majority of the inputs required for performing all functionality of configurable logic blocks are typically restricted to inputs associated with a particular configurable logic block, other than through the use of the switch box. The same is true for outputs of a particular configurable logic block which are restricted to within the configurable logic block other than through the use of the switch box.

Accordingly, it is desirable to design a programmable logic structure that enhances the connectivity of inputs and outputs in a programmable logic and routing module without boundary limitations.

SUMMARY OF THE INVENTION

The present invention describes a programmable logic structure that has a set of dedicated lines which extend internally throughout different dedicated logic cells within a logic and routing block (LRB), extend from a previous logic routing block to the present logic and routing block, or extend from the present logic and routing block to the next logic and routing block. One set of dedicated lines from a first logic and routing block can be stitched to another set of dedicated lines of a second logic and routing block for extending the reach as well as bypassing a logic and routing block, or bypassing a dedicated logic cell in the same logic and routing block. The dedicated lines between logic and routing blocks allow a logic and routing block to receive more inputs from its own switch box or to drive more outputs than provided by the logic and routing block as specified by a given function.

Broadly stated, claim 1 recites a programmable logic structure comprising a first logic and routing block; a second logic and routing block; and first one or more dedicated lines extending through the first logic and routing block and the second logic and routing block.

Advantageously, the present invention provides a design for signals to cross a logic and routing block boundary. In addition, the present invention advantageously allows signals to skip a particular logic and routing block so that inputs and outputs need not be in contiguous locations. Furthermore, the present invention advantageously allows the creation of large wide logic structures in which functional blocks (e.g. function generators, multiplexers, wide gates, and wide multiplexers) with different inputs but common control signals in producing the benefits of not having to use a switch box in order to distribute control signals to all of the functional blocks in a given structure, thereby significantly reducing the burden on the switch box to distribute high fanout control and data lines in a programmable logic device.

Other structures and methods are disclosed in the detailed description below. This summary does not purport to define the invention. The invention is defined by the claims. These and other embodiments, features, aspects, and advantages of the invention will become better understood with regard to the following description, appended claims and accompanying drawings.

Reference symbols or names are used in the Figures to indicate certain components, aspects or features therein, with reference symbols common to more than one Figure indicating like components, aspects or features shown therein.

DETAILED DESCRIPTION OF PREFERRED EMBODIMENTS

Figure 1:
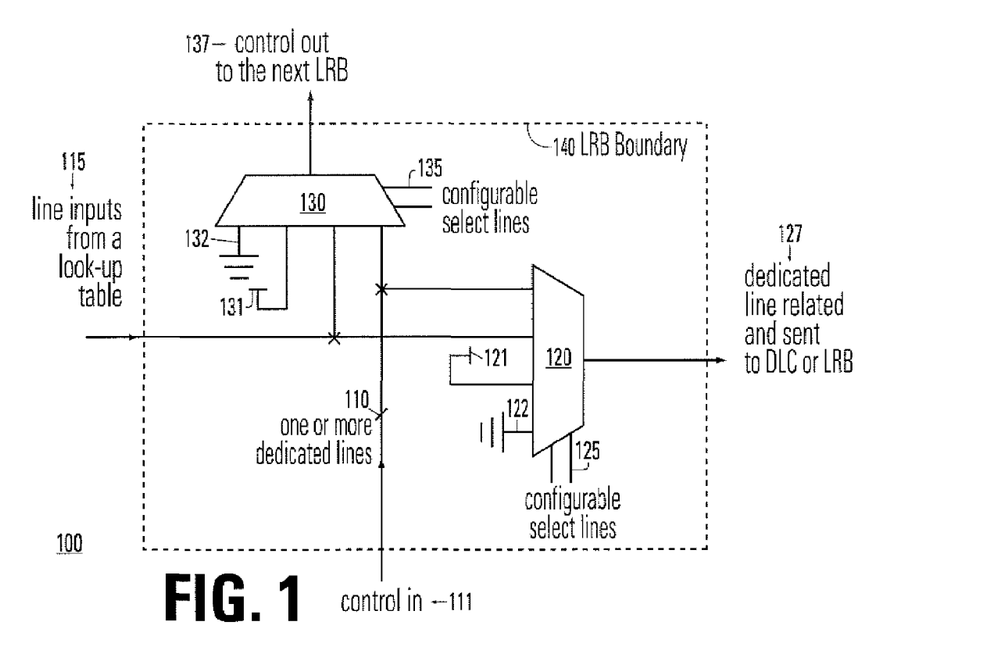
FIG. 1 is a logic diagram illustrating a partial dedicated logic cell employing one or more dedicated lines in a logic and routing block in accordance with the present invention.

Referring now to FIG. 1, there is shown a logic diagram illustrating a partial dedicated logic cell 100 employing the use of one or more dedicated lines 110 for connections between logic and routing blocks (LRBs), or connections from one dedicated logic cell (DLC) to another dedicated logic cell. The one or more dedicated lines 110 enter the partial dedicated logic cell 100 in a present logic and routing block through a control input line 111. The first multiplexer 120 has a first input connected to the control input 111 for receiving the one or more dedicated lines 110, a second input connected to line inputs 115 from a look-up table, a third input connected to a Vdd 121, and a fourth input connected a ground 122, and an output 127 connected to an adjacent dedicated logic cell in the same logic and routing block. Configurable select lines 125 allow selection from one of the four inputs 110, 115, 121, or 122 in the first multiplexer 120 for generating the output 127 to the adjacent dedicated logic cell in the same logic and routing block. The second multiplexer 130 has a first input connected to a control input 111 for receiving the one or more dedicated lines 110, a second input connected to line inputs 115 from the look-up table, a third input connected to a Vdd 131, and a fourth input connected to a ground 132, and an output 137 connected to the next logic and routing block (or the next dedicated logic cell.) Configurable select lines 135 allow selection from one of the four inputs, 111, 115, 131, or 132 in the second multiplexer 130 to the next logic and routing block.

The logic and routing blocks that provide the additional inputs need not be adjacent to the current logic and routing block where the function is implemented. The one or more dedicated lines can be used either as data or control signals. By deploying the one or more dedicated lines, the connectivity of a logic and routing block for enabling input and output connections can be made seamlessly irrespective of a logic and routing block boundary 140. The one or more dedicated lines 110 connect between logic and routing blocks that allow a logic and routing block to receive inputs from other logic and routing blocks when a given function implemented in the logic and routing block requires more inputs than provided by the switchbox 250 in the logic and routing block. The one or more dedicated lines 110 also allow the logic and routing block to drive more outputs than provided by the present logic and routing block.

Figure 2:
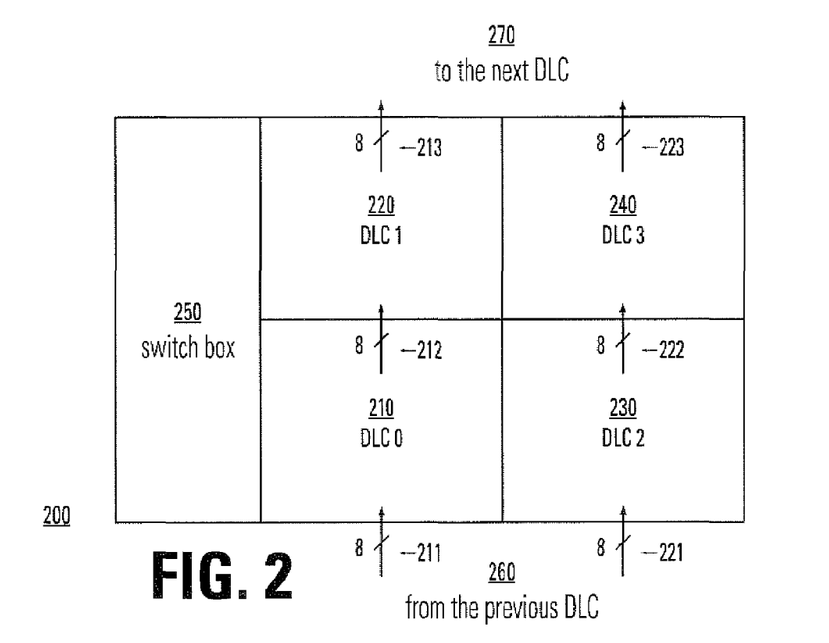
FIG. 2 is an architectural diagram illustrating a logic and routing block having multiple dedicated logic cells in a logic and routing block in accordance with the present invention.

In this embodiment, the partial dedicated logic cell 100 employs eight dedicated lines 110 for each pair of dedicated logic cells. The eight dedicated lines 110 can be used as either data or control signal lines for various modes of operation. The eight dedicated lines are fed by eight outputs of a dedicated logic cell (not shown) or from a previous set of dedicated lines (not shown). Each dedicated line in the eight dedicated lines 110 can be tied to a high or low voltage. The eight dedicated lines 110 are fed to functional blocks to enable creation of larger functional blocks than permissible from a switch box, as shown in FIG. 2. For example, 6 and 7-input general purpose function generators (i.e., look-up tables or "LUTs") and 8-input limited function generators are possible by using the dedicated input lines to provide inputs from other logic and routing blocks.

In FIG. 2, there is shown an architectural diagram illustrating a logic and routing block 200 comprising a first dedicated logic cell (DLC 0) 210, a second dedicated logic cell (DLC 1) 220, a third dedicated logic cell (DLC 2) 230, a fourth dedicated logic cell (DLC 3) 240 and a switch box 250 for providing programmable switch matrices. A set of dedicated lines is used to interconnect between adjacent dedicated logic cells, either for connecting to adjacent dedicated logic cells within the logic and routing block, adjacent dedicated logic cells between the logic and routing block 200 and a previous logic and routing block, or adjacent dedicated logic cells between the logic routing block 200 and a next logic and routing block. A first set of eight dedicated lines 211 is connected from a previous dedicated logic cell 260 (not shown) to the first dedicated logic cell 210. A second set of eight dedicated lines 212 is connected from the first dedicated logic cell DLC0 210 to the second dedicated cell DLC1 220. A third set of dedicated lines 213 is connected from the second dedicated cell 220 to the next dedicated local cell 270 (not shown). A fourth set of eight dedicated lines 221 is connected from the previous dedicated logic cell 260 (not shown) to the third dedicated logic cell 230. A fifth set of eight dedicated lines 222 is connected from the third dedicated logic cell 230 to the fourth dedicated logic cell 240. A sixth set of eight dedicated lines 223 is connected from the fourth dedicated logic cell 240 to the next dedicated logic cell 270 (not shown). The switch box 250 functions as a source for feeding control of data signals to any one of the dedicated lines 211, 212, 213, 221, 222, or 223. While the first set of eight dedicated lines 211 and the fourth set of eight dedicated lines 221 are connected from the previous logic and cell block 260, (not shown) the third set of eight dedicated lines 213 and the sixth set of eight dedicated lines 223 are connected to the next logic and cell block 270 (not shown).

The one ore more dedicated lines can be driven by the previous corresponding one or more dedicated lines as well as driving the next corresponding one or more dedicated lines, which would extend the distance of the dedicated lines. In effect, one set of dedicated lines can be connected ("stitched") to another set of dedicated lines, as may be called for by a particular programmable logic device, for concatenating different sets of dedicated lines together that extend across different logic and routing blocks.

Figure 3:
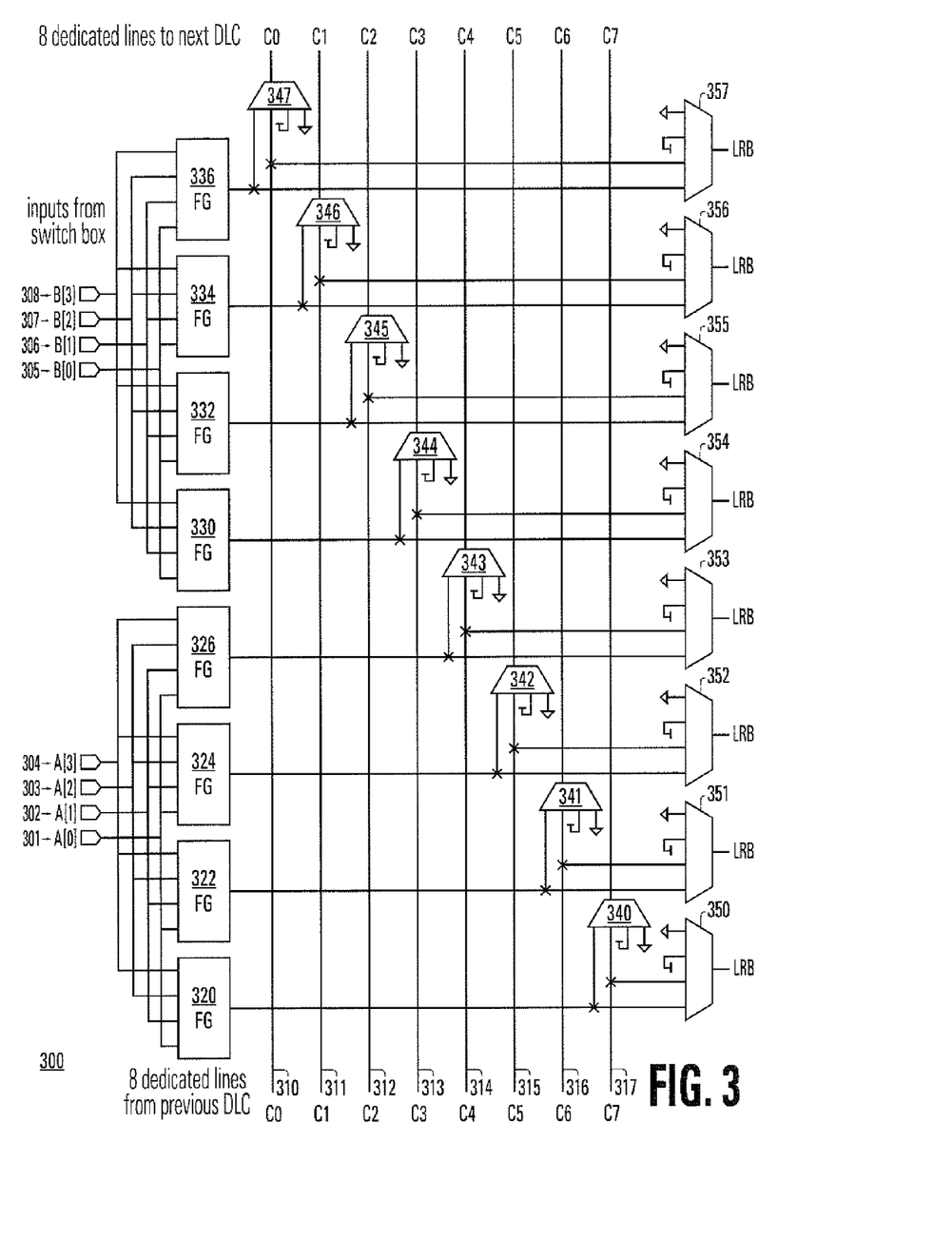
FIG. 3 is a logic diagram illustrating a dedicated logic cell employing eight dedicated lines in accordance with the present invention.

In FIG. 3, there is shown a logic diagram illustrating the first implementation of a dedicated logic cell 300 with eight dedicated lines 310–317. The dedicated logic cell 300 comprises a first set of function generators, a first function generator (FG) 320, a second function generator 322, a third function generator 324, and a fourth function generator 326 where each function generator has four inputs for receiving A[0] 301, A[1] 302, A[2] 303, and A[3] 304 from the switch box 250. The dedicated logic cell 300 comprises a second set of function generators, a fifth function generator 330, a sixth function generator 332, a seventh function generator 334, and an eighth function generator 336 where each function generator has four inputs for receiving B[0] 305, B[1] 306, B[2] 307, and B[3] 308 from the switch box 250. A first multiplexer 340 has a first input connected to an output of the first function generator 320, a second input connected to the eighth dedicated line C7 317, a third input connected to a Vdd, a fourth input connected to a ground, and an output connected to the next DLC. A second multiplexer 341 has a first input connected to an output of the second function generator 322, a second input connected to the seventh dedicated line C6 316, a third input connected to a Vdd, a fourth input connected to a ground, and an output connected to the next DLC. A third multiplexer 342 has a first input connected to an output of the third function generator 324, a second input connected to the fifth dedicated line C5 315, a third input connected to a ground, a fourth input connected to a Vdd, and an output connected to the next DLC. A fourth multiplexer 343 has a first input connected to an output of the fourth function generator 326, a second input connected to the fifth dedicated line C4 314, a third input connected to a Vdd, a fourth input connected to a ground, and an output to the next DLC. A fifth multiplexer 344 has a first input connected to an output of the fifth function generator 330, a second input connected to the fourth dedicated line C3 313, a third input connected to a Vdd, a fourth input connected to a ground, and an output connected to the next DLC. A sixth multiplexer 345 has a first input connected to an output of the sixth function generator 332, a second input connected to the third dedicated line C2 312, a third input connected to a Vdd, a fourth input connected to a ground, and an output connected to the next DLC. A seventh multiplexer 346 has a first input connected to an output of the seventh function generator 334, a second input connected to the second dedicated line C1 311, a third input connected to a Vdd, a fourth input connected to a ground, and an output connected to the next DLC. An eighth multiplexer 347 has a first input connected to an output of the eighth function generator 336, a second input connected to the first dedicated line C0 310, a third input connected to a Vdd, a fourth input connected to a ground, and an output connected to the next DLC.

A corresponding set of multiplexers is connected to the respective one of the multiplexers 340–347 for generating outputs to logic and routing blocks. A ninth multiplexer 350 has a first input connected to the output of the first function generator 320, a second input connected to the eighth dedicated line C7 317, a third input connected to a Vdd, a fourth input connected to a ground, and an output for connecting to a logic and routing block. A tenth multiplexer 351 has a first input connected to the output of the second function generator 322, a second input connected to the seventh dedicated line C6 316, a third input connected to a Vdd, a fourth input connected to a ground, and an output for connecting to the logic and routing block. An eleventh multiplexer 352 has a first input connected to the output of the third function generator 324, a second input connected to the sixth dedicated line C5 315, a third input connected to a Vdd, a fourth input connected to a ground, and an output for connecting to the logic and routing block. A twelfth multiplexer 353 has a first input connected to the output of the fourth function generator 326, a second input connected to the fifth dedicated line C4 314, a third input connected to a Vdd, a fourth input connected to a ground, and an output for connecting to the logic and routing block. A thirteenth multiplexer 354 has a first input connected to the output of the fifth function generator 330, a second input connected to the fourth dedicated line C3 313, a third input connected to a Vdd, a fourth input connected to a ground, and an output for connecting to the logic and routing block. A fourteenth multiplexer 355 has a first input connected to the output of the sixth function generator 332, a second input connected to the third dedicated line C2 312, a third input connected to a Vdd, a fourth input connected to a ground, and an output for connecting to the logic and routing block. A fifteenth multiplexer 356 has a first input connected to the output of the seventh function generator 334, a second input connected to the second dedicated line C1 311, a third input connected to a Vdd, a fourth input connected to a ground, and an output for connecting to the logic and routing block. A sixteenth multiplexer 357 has a first input connected to the output of the eighth function generator 336, a second input connected to the first dedicated line C0 310, a third input connected to a Vdd, a fourth input connected to a ground, and an output for connecting to the logic and routing block.

Figure 4:
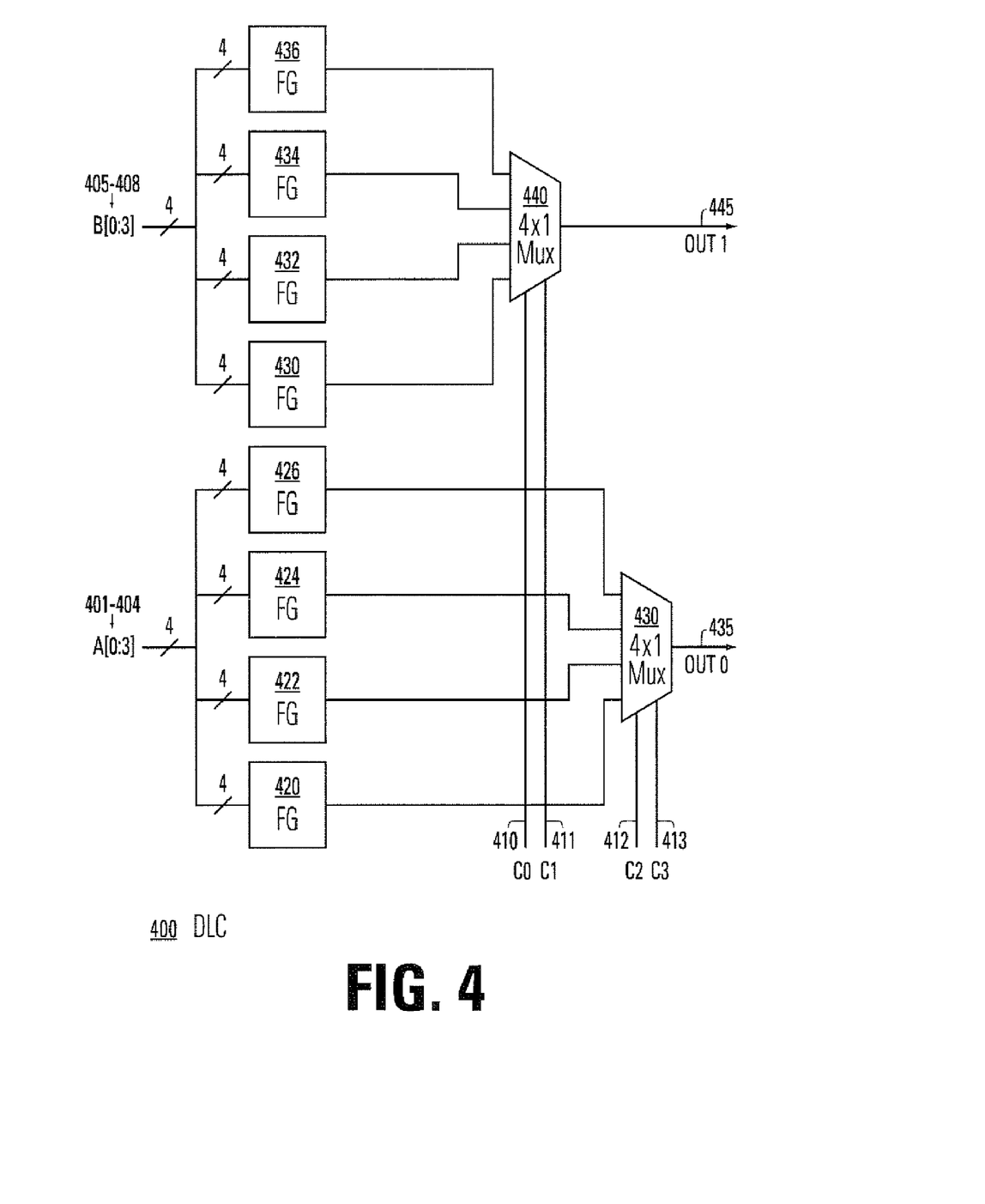
FIG. 4 is a logic diagram illustrating the first implementation of a dedicated logic cell that operates as an 8-input function generator in accordance with the present invention.

The following diagrams, FIGS. 4 through 9, show the different applications of adopting the use of the one or more dedicated lines. Turning now to FIG. 4, there is shown a logic diagram illustrating the first implementation of a dedicated logic cell 400 that operates as a 7-input function generator, which is equivalent to two 6-input look-up tables. The dedicated logic cell 400 employs dedicated lines C0 410, C1 411, C2 412, and C3 413 that function as select lines to 4:1 multiplexers 430 and 440. If the eight inputs are referred to as I[0:7], the first four inputs I[0:3] are supplied by either A[0:3] 401–404 or B[0:3] 405–408, the fifth and sixth inputs are generated from C0 412 and C1 411, and the sixth and seventh inputs are generated from C2412 and C3412. A first 6-input look-up table in the logic dedicated cell 400 comprises a first function generator 420, a second function generator 422, a third function generator 424, and a fourth function generator 426 that have outputs feeding into inputs of the 4:1 multiplexer 430. Each of the first, second, third and fourth function generators 420, 422, 424, and 426 have four inputs for receiving the incoming signals A[0:3] 401–404. The dedicated lines C2 412 and C3 413 function as select lines to the 4:1 multiplexer 430 for selecting one of the inputs from either the first, second, third, or fourth function generator 420, 422, 424, 426, as well as generating an output signal of OUT0 435. A second 6-input look-up table in the logic dedicated cell 400 comprises a fifth function generator 430, a sixth function generator 432, a seventh function generator 434, and an eighth function generator 436 that have outputs feeding into inputs of the 4:1 multiplexer 440. Each of the first, second, third and fourth function generators 430, 432, 434, and 436 have four inputs for receiving the incoming signals B[0:3] 405–408. The dedicated lines C0 410 and C1 411 function as select lines to the 4:1 multiplexer 440 for selecting one of the inputs from either the fifth, sixth, seventh, or eighth function generator 430, 432, 434, 436, and generating an output signal of OUT1 445.

Figure 5:
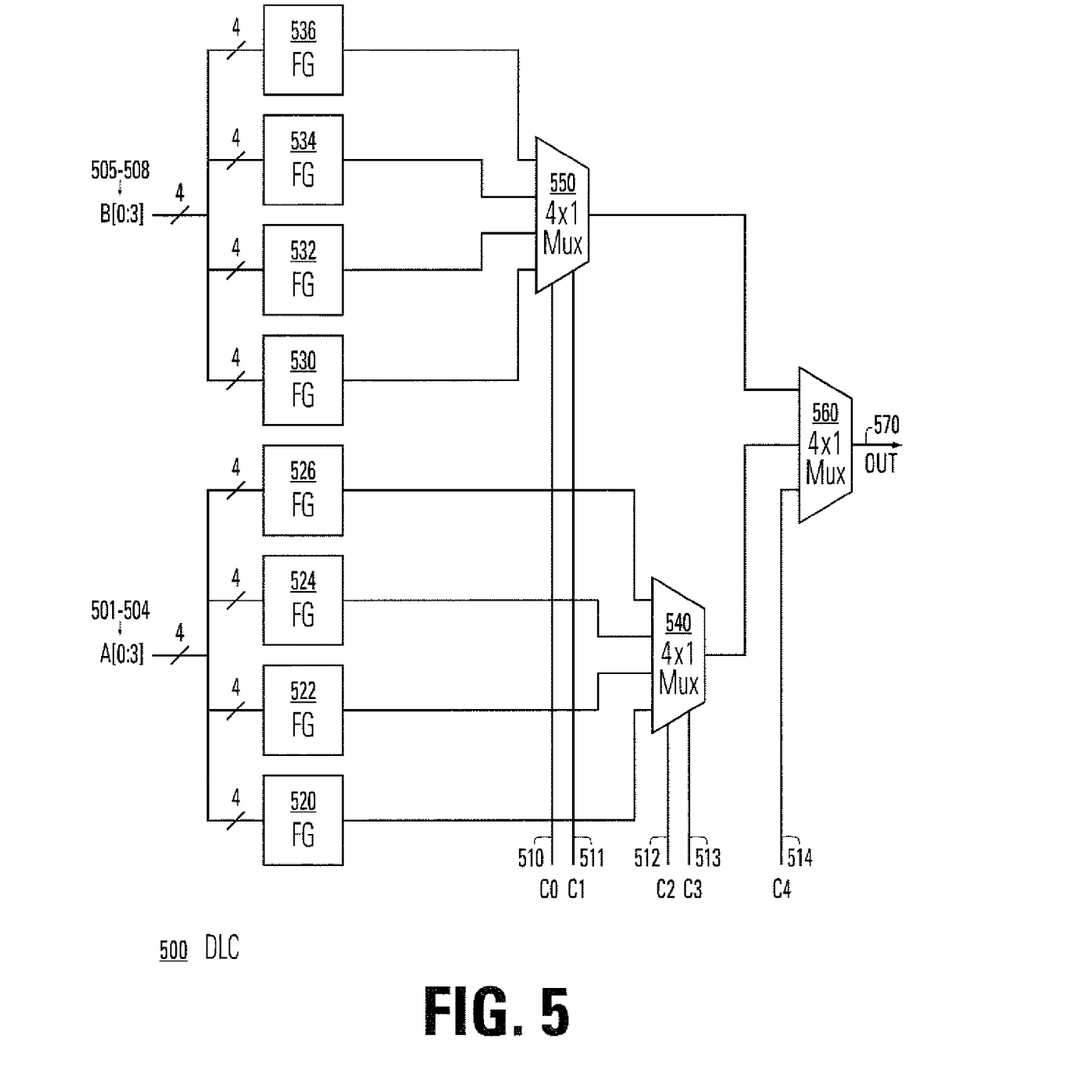
FIG. 5 is a logic diagram illustrating the second implementation of a dedicated logic cell that serves as a 7-input function generator in accordance with the present invention.

In FIG. 5, there is shown a logic diagram illustrating the second implementation of a dedicated logic cell 500 that serves as a 7-input function generator. If the seven inputs are referred to as I[0:6], the first four inputs I[0:3] are supplied by either A[0:3] 501–504 or B[0:3] 505–508, the fifth input I[4] is generated from either a configurable select line C0 510 or C2 512, the sixth input I[5] is generated from either a configurable select line C1 511 or C3 513, and the seventh input I[6] is supplied by a configurable select line C4 514. The dedicated logic cell 500 comprises a first set of function generators having a first function generator 520, a second function generator 522, a third function generator 524, and a fourth function generator 526 where each function generator has four inputs for receiving A[0:3] 501–504 and an output connected to a 4:1 multiplexer 540. The dedicated logic cell 500 comprises a second set of function generators having a fifth function generator 530, a sixth function generator 532, a seventh function generator 534, and an eighth function generator 536 where each function generator has four inputs for receiving B[0:3] 505–508 and an output connected to the 4:1 multiplexer 550. A third multiplexer 560 has a first input connected to the output of the first 4:1 multiplexer 540, a second input connected to the output of the second 4:1 multiplexer 550, and a third input connected to the dedicated line C4 514 and an output 570.

Figure 6:
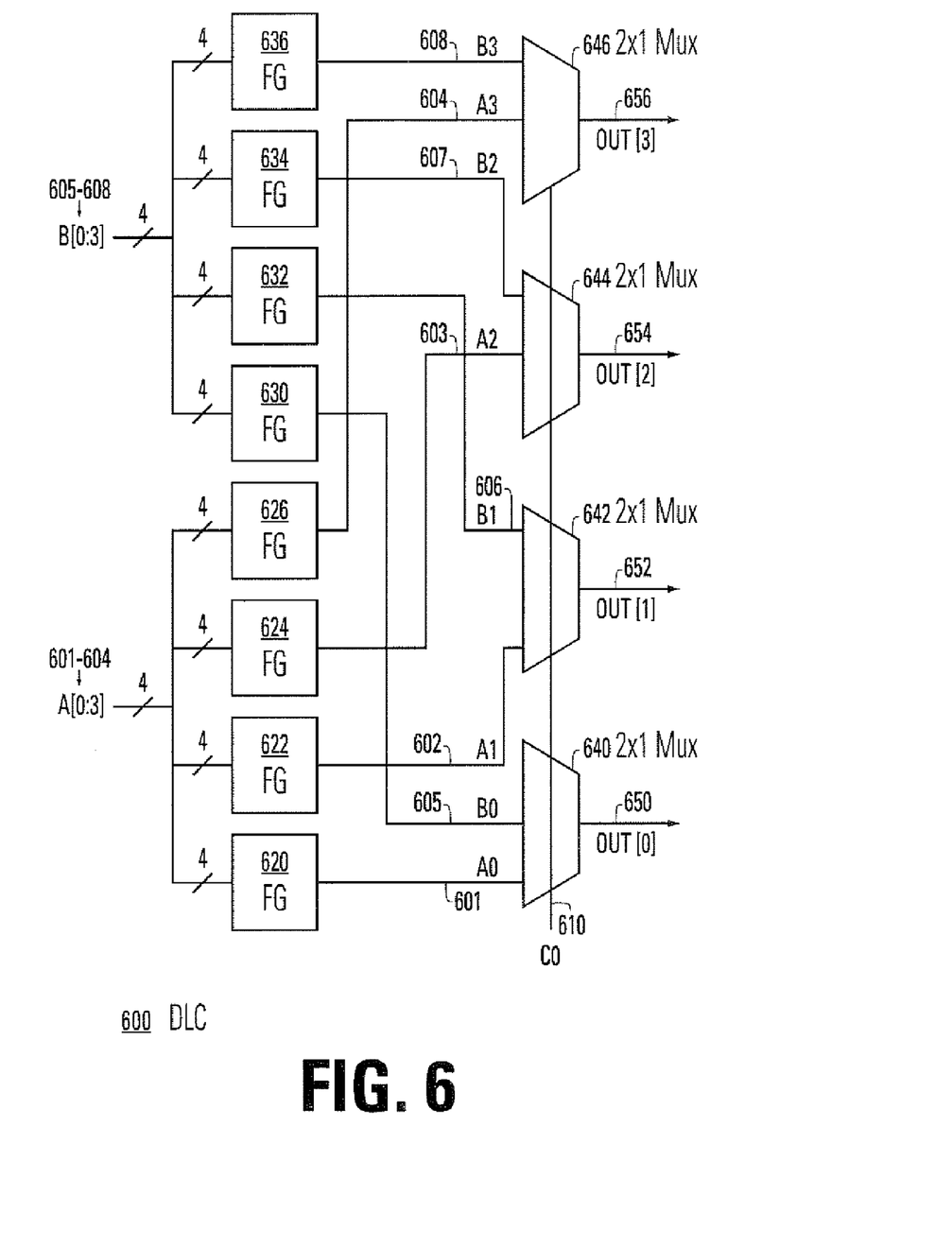
FIG. 6 is a logic diagram illustrating the third implementation of a dedicated logic cell employing four 2:1 multiplexers with a common select line in accordance with the present invention.

FIG. 6 shows a logic diagram illustrating the third implementation of a dedicated logic cell 600 employing four 2:1 multiplexers with a common select line. A dedicated line 610 C0 functions as a common select line that runs through all four 2:1 multiplexers 640, 642, 644 and 646. The dedicated logic cell 600 comprises a first set of function generators having a first function generator 620, a second function generator 622, a third function generator 624, and a fourth function generator 626 where each function generator has four inputs for receiving A[0:3] 601–604. The dedicated logic cell 600 comprises a second set of function generators having a fifth function generator 630, a sixth function generator 632, a seventh function generator 634, and an eighth function generator 636 where each function generator has four inputs for receiving B[0:3] 605–608. A first 2:1 multiplexer 640 has a first input for receiving the A[0] 601 and a second input for receiving the B[0] 605, and generating an OUT[0] 650. A second 2:1 multiplexer 642 has a first input for receiving the A[1] 602 and a second input for receiving the B[1] 606, and generating an OUT[1] 652. A third 2:1 multiplexer 644 has a first input for receiving the A[2] 603 and a second input for receiving the B[2] 607, and generating an out[2] 654. A fourth 2:1 multiplexer 646 has a first input for receiving the A[3] 604 and a second input for receiving the B[3] 607, and generating an OUT[3] 656.

Figure 7:
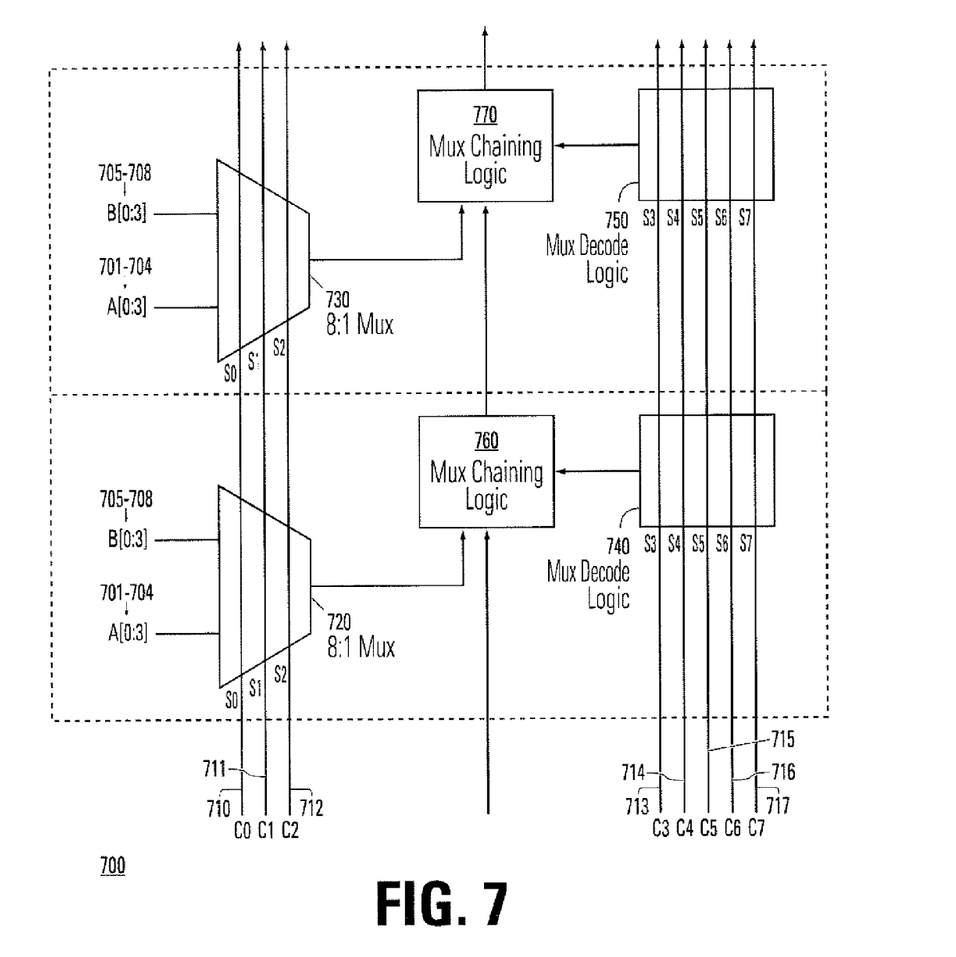
FIG. 7 is a logic diagram illustrating the fourth implementation of using eight dedicated lines in large multiplexers in accordance with the present invention.

FIG. 7 is a logic diagram illustrating the fourth implementation of using eight dedicated lines in large multiplexer circuits 700. The eight dedicated lines, C0 710, C1 711, C2 712, C3 713, C4 714, C5 715, C6 716, and C7 717, serve as select lines or control lines for multiplexers 720, 730, 740, and 750. The first multiplexer 720 has first inputs for receiving A[0:3] 701–704 and second inputs for receiving B[0:3] 705–708. The second multiplexer 730 has first inputs for receiving A[0:3] 701–704 and second inputs for receiving B[0:3] 705–708. The dedicated lines C0 710, C1 711, and C2 712 function as select lines S0, S1, and S2, respectively, for both the first and second multiplexers 720 and 730. The three select lines S0, S1, and S3 provide the capability to the first and second multiplexers 720 and 730 to function as 8:1 multiplexers, where one of the eight inputs will be selected for sending to the output. Two multiplexer decode logics 730 and 740 operate to decode the inputs C3 713, C4 714, C5 715, C6 716, and C7 717. The dedicated lines C3 713, C4 714, C5 715, C6 716, C7 717 function as select lines S3, S4, S5, S6, S7, respectively, for both the two multiplexer decode logics 730 and 740. A first chaining logic 760 has a first input connected to the output of the first 8:1 multiplexer 720, a second input connected to a previous multiplexer chaining multiplexer (not shown), a third input connected to the output of the first multiplexer decode logic 740, and an output. A second chaining logic 770 has a first input connected to the output of the second 8:1 multiplexer 730, a second input connected to the output of the first multiplexer chaining logic 760, a third input connected to the output of the second multiplexer decode logic 750, and an output. The combination of the eight dedicated lines, C0 710, C1 711, C2 712, C3 713, C4 714, C5 715, C6 716, and C7 717, provides 256 inputs into the circuit 700 that function as a 256:1 multiplexer.

Figure 8:
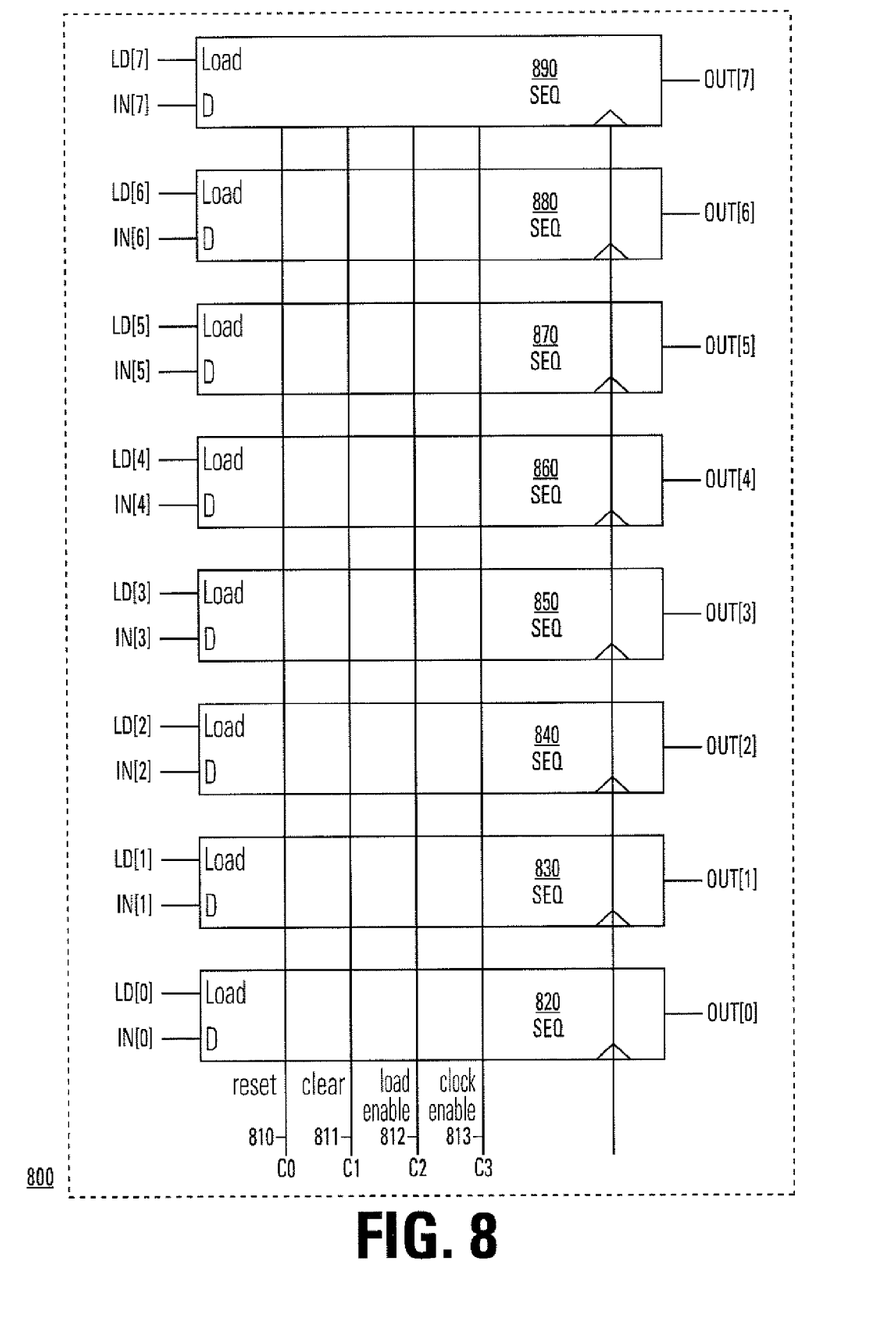
FIG. 8 is a logic diagram illustrating the fifth implementation of using dedicated lines as control lines in a configurable sequential circuit in accordance with the present invention.

In FIG. 8, there is shown a logic diagram illustrating the fifth implementation of using dedicated lines as control lines in a configurable sequential circuit 800. A set of dedicated lines C0 810, C1 811, C2 812, and C3 813, provides control signals to a set of sequential elements sharing the same set of control signals that includes a reset (RST) signal, a clear (CLR) signal, a load enable (LDEN) signal, and a clock enable (CE) signal. In this embodiment, the configurable sequential circuit 800 comprises a first configurable sequential element 820, a second configurable sequential element 830, a third configurable sequential element 840, a fourth configurable sequential element 850, a fifth configurable sequential element 860, a sixth configurable sequential element 870, a seventh configurable sequential element 880, and an eighth configurable sequential element 890. The first dedicated line C0 810 functions as a reset (RST) line, the second dedicated line C1 811 functions as a clear (CLR) line, the third dedicated line C2 812 functions as a load enable (LDEN) line, and the fourth dedicated line C3 813 functions as a clocking enable (CE) line. A clock signal 815 is also fed into each of the configurable sequential elements, 820, 830, 840, 850, 860, 870, 880 and 890.

The first configurable sequential element 820 has a first input for receiving IN[0], a second input for receiving a load data LD[0], and an output for generating an OUT[0]. When the LDEN signal 812 is asserted, the LD[0] line is active to load the data IN[0] into the first configurable sequential element 820 and generating the data to the OUT[0]. The second configurable sequential element 830 has a first input for receiving IN[1], a second input for receiving a load data LD[1], and an output for generating an OUT[1]. When the LDEN signal 812 is asserted, the LD[1] line is active to load the data IN[1] into the second configurable sequential element 830 and to generate the data to the OUT[1]. The third configurable sequential element 840 has a first input for receiving IN[2], a second input for receiving a load data LD[2], and an output for generating an OUT[2]. When the LDEN signal 812 is asserted, the LD[2] line is active to load the data IN[2] into the third configurable sequential element 840 and to generate the data to the OUT[2]. The fourth configurable sequential element 850 has a first input for receiving IN[3], a second input for receiving a load data LD[3], and an output for generating an OUT[3]. When the LDEN signal is asserted, the LD[3] signal 812 is active to load the data IN[3] into the fourth configurable sequential element 850 and to generate the data to the OUT[3]. The fifth configurable sequential element 860 has a first input for receiving IN[4], a second input for receiving a load data LD[4], and an output for generating an OUT[4]. When the LDEN signal 812 is asserted, the LD[4] line is active to load the data IN[4] into the fifth configurable sequential element 860 and to generate the data to the OUT[4]. The sixth configurable sequential element 870 has a first input for receiving IN[5], a second input for receiving a load data LD[5], and an output for generating an OUT[5]. When the LDEN signal 812 is asserted, the LD[5] line is active to load the data IN[5] into the sixth configurable sequential element 870 and to generate the data to the OUT[5]. The seventh configurable sequential element 880 has a first input for receiving IN[6], a second input for receiving a load data LD[6], and an output for generating an OUT[6]. When the LDEN signal 812 is asserted, the LD[6] line is active to load the data IN[6] into the seventh configurable sequential element 880 and to generate the data to the OUT[6]. The eighth configurable sequential element 890 has a first input for receiving IN[7], a second input for receiving a load data LD[7], and an output for generating an OUT[7]. When the LDEN signal 812 is asserted, the LD[7] line is active to load the data IN[7] into the eighth configurable sequential element 890 and to generate the data to the OUT[7].

Figure 9:
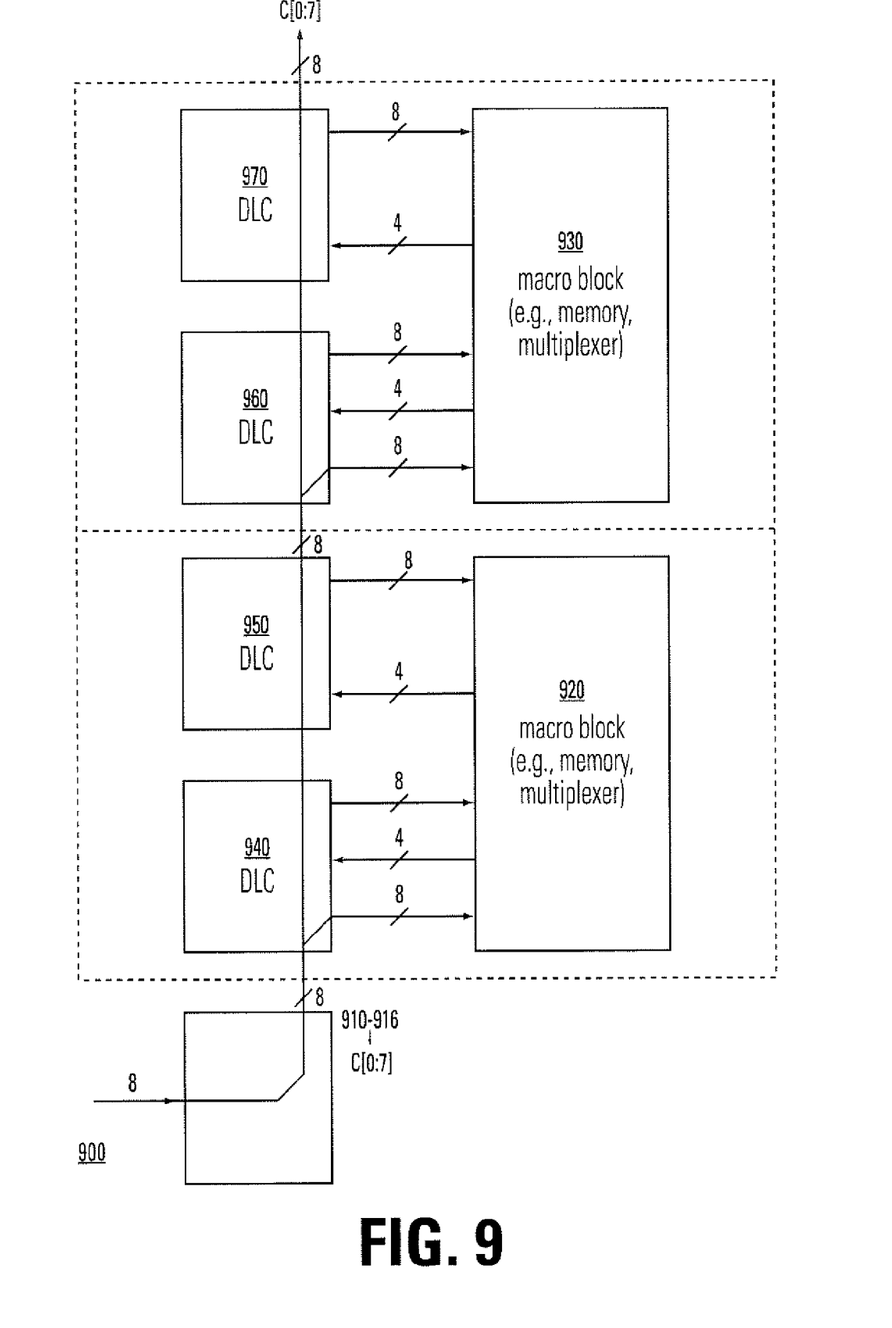
FIG. 9 is a logic diagram illustrating the sixth implementation of a programmable logic circuit with shared dedicated lines as control lines among multiple macro blocks in accordance with the present invention.

FIG. 9 is a logic diagram illustrating the sixth implementation of a programmable logic circuit 900 that shares dedicated lines as control lines among multiple macro blocks. Eight dedicated lines C0 910, C1 911, C2 912, C3 913, C4 914, C5 915, C6 916, C7 917, operate as control lines for larger functional macro blocks such as memory, multiplier and other such macro blocks such that a set of logic and routing blocks provide inputs, outputs and control signals. The eight dedicated lines C0 910, C1 911, C2 912, C3 913, C4 914, C5 915, C6 916, C7 917 serve as common control signals that are shared among a first macro block 920 and a second macro block 930. The eight dedicated lines C0–C7 910–917 are connected to the first macro block 920 through a first dedicated logic cell 940, and are connected to the second macro block 930 through a third dedicated logic cell 960. The eight dedicated lines C0–C7 910–917 are connected to the first dedicated logic cell 940, a second dedicated logic cell 950, the third dedicated logic cell 960, and a fourth dedicated logic cell 970.

Figure 10:
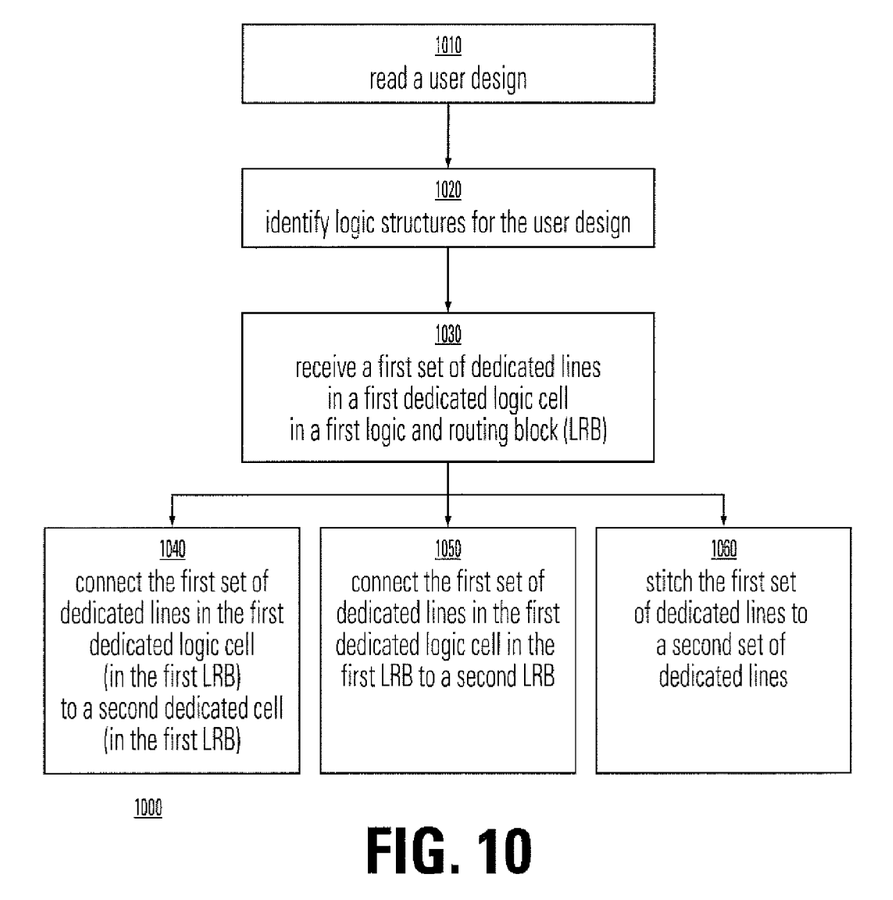
FIG. 10 is a flow diagram illustrating the process of operating one or more dedicated lines in a logic and routing block in accordance with the present invention.

FIG. 10 is a flow diagram illustrating the process of programming a programmable logic circuit having at least one or more dedicated lines in a logic and routing block 200. At step 1010, the process 1000 reads a particular programmable logic design selected by a user. The process 1000 identifies logic structures for implementation of the selected design at step 1020. In a programmable logic circuit, a first dedicated logic cell in a first LRB receives a first set of dedicated lines at step 1030. Depending on the logic functions to be implemented, there are several options in connecting the first set of dedicated lines in the first dedicated logic cell in the first LRB. With a first option at step 1040, the first set of dedicated lines in the first dedicated logic cell in the first LRB are connected to a second dedicated logic cell in the same LRB. With a second option at step 1050, the first set of dedicated lines in the first dedicated logic cell in the first LRB are connected to a second LRB. With a third option at step 1060, the first set of dedicated logic cell in the first logic cells in the first LRB is stitched to a second set of dedicated lines for connection to an LRB adjacent to the first LRB, or skip over an adjacent LRB to a non-contiguous LRB relative to the first LRB.

Those skilled in the art can appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications, whether explicitly provided for by the specification or implied by the specification, will become apparent to the skilled practitioner upon a study of the drawings, specification, and following claims.

We claim:

1. A programmable logic structure, comprising:
a first logic and routing block;
a second logic and routing block; and
first one or more dedicated lines extending through the first logic and routing block and the second logic and routing block, the first logic and routing block having a first dedicated logic cell including:
a first multiplexer having a first input connected to the first one or more dedicated lines and a second input connected to a look-up table, the first multiplexer having at least one configurable line for selecting from one of the two inputs and generating an output connected to a second dedicated logic cell in the first logic and routing block; and
a second multiplexer having a first input connected to the first one or more dedicated lines and a second input connected to the look-up table, the second multiplexer having at least one configurable line for selecting from one of the two inputs and generating an output connected to the second logic and routing block.

2. A programmable logic structure, comprising:
a first logic and routing block;
a second logic and routing block; and
first one or more dedicated lines extending through the first logic and routing block and the second logic and routing block, the first logic and routing block having a first dedicated logic cell including:
a first multiplexer having a third input connected to a Vdd, and a fourth input connected to a ground; and
a second multiplexer having a third input connected to the Vdd, and a fourth input connected to the ground.

3. A programmable logic structure, comprising:
a first logic and routing block;
a second logic and routing block; and
first one or more dedicated lines extending through the first logic and routing block and the second logic and routing block, the first logic and routing block including:
a first dedicated logic cell;
a second dedicated logic cell, the first one or more dedicated lines connecting through the first dedicated logic cell and the second dedicated logic cell;
a third dedicated logic cell;
a fourth dedicated logic cell, second one or more dedicated lines connecting through the third dedicated logic cell and the fourth dedicated logic cell; and
a switch box connected to the first, second, third, and fourth dedicated logic cells, the first one or more dedicated lines, and the second one or more dedicated lines.

4. A programmable logic structure, comprising:
a first logic and routing block;
a second logic and routing block; and
first one or more dedicated lines extending through the first logic and routing block and the second logic and routing block, wherein the first logic and routing block having a dedicated logic cell including:
a first function generator having an input for receiving an input signal and an output;
a first multiplexer having a first input connected to the output of the first function generator, a second input connected to a first dedicated line, and an output connected to a next dedicated logic cell; and
a second multiplexer having an input for connecting to the output of the first function generator, a second input for connecting to the first dedicated line, and an output connected to the second logic and routing block.

5. A programmable logic structure, comprising:
a first logic and routing block;
a second logic and routing block; and
first one or more dedicated lines extending through the first logic and routing block and the second logic and routing block, wherein the first logic and routing block having a dedicated logic cell including:
a first function generator having inputs for receiving a plurality of input signals and an output;
a second function generator having inputs for receiving the plurality of input signals and an output;
a third function generator having inputs for receiving the plurality of input signals and an output;
a fourth function generator having inputs for receiving the plurality of input signals and an output; and
a 4:1 multiplexer having a first input connected to the output of the first function generator, a second input connected to the output of the second function generator, a third input connected to the output of the third function generator, a fourth input connected to the fourth function generator, a first select line feeding from a first dedicated line in the one or more dedicated lines, a second select line feeding from a second dedicated line in the one or more dedicated lines and an output, wherein the first and second select lines select from one of the four inputs in the 4:1 multiplexer for generating an output signal to the output.

6. A programmable logic structure, comprising:
a first logic and routing block;
a second logic and routing block; and
first one or more dedicated lines extending through the first logic and routing block and the second logic and routing block, the first logic and routing block having a dedicated logic cell including:
    a first function generator having inputs for receiving a first set of input signals and an output;
    a second function generator having inputs for receiving a second set of input signals and an output;
    a first 2:1 multiplexer having a first input for connecting to the output of the first function generator, a second input for connecting to the output of the second function generator, a first select line feeding from a first dedicated line in the one or more dedicated lines, and an output;
    a third function generator having inputs for receiving the first set of input signals and an output;
    a fourth function generator having inputs for receiving the second set of input signals and an output; and
    a second 2:1 multiplexer having a first input for connecting to the output of the third function generator, a second input for connecting to the output of the fourth function generator, the first select line feeding from a first dedicated line in the one or more dedicated lines connecting to both the first multiplexer and the second multiplexer such that the first and second multiplexers share the common select line.

7. A programmable logic structure, comprising:
a first logic and routing block;
a second logic and routing block; and
first one or more dedicated lines extending through the first logic and routing block and the second logic and routing block, the first logic and routing block having a dedicated logic cell including:
    an 8:1 multiplexer having first inputs for receiving a first plurality of input signals, second inputs for receiving a second plurality of input signals, at least one dedicated line in the one or more dedicated lines functioning as select lines for the 8:1 multiplexer, and an output;
    a multiplexer decode logic having inputs for receiving at least one dedicated line in the one or more dedicated lines and an output; and
    a multiplexer chaining logic having a first input for connecting to the output of the 8:1 multiplexer, a second input, and a third input for connecting to the output of the multiplexer decode logic.

8. A programmable logic structure, comprising:
a first logic and routing block;
a second logic and routing block; and
first one or more dedicated lines extending through the first logic and routing block and the second logic and routing block;
wherein the first logic and routing block having a configurable sequential circuit which comprises a first sequential circuit having an input for receiving a load data signal, a second input for receiving data, a first select input for connecting to a first dedicated line that functions as a reset line, a second select input for connecting to a second dedicated line that functions as a clear line, a third select input for connecting to a third dedicated line that functions as a clock enable line, a fourth select input for connecting to a fourth dedicated line that functions as an enable line, and an output.

9. A programmable logic structure, comprising:
a first logic and routing block;
a second logic and routing block; and
first one or more dedicated lines extending through the first logic and routing block and the second logic and routing block;
wherein the first logic and routing block including:
    a first dedicated logic cell having inputs for receiving the one or more dedicated lines, first outputs and second outputs; and
    a macro block having inputs connected to the outputs of the first dedicated logic cell;
wherein the one or more dedicated lines connect to first outputs in the first dedicated logic cell to a next dedicated logic cell and the one or more dedicated lines connect to second outputs in the first dedicated logic cell to the inputs of the macro block.

10. A programmable logic structure, comprising:
a first logic and routing block;
a second logic and routing block; and
first one or more dedicated lines extending through the first logic and routing block and the second logic and routing block;
a third logic and routing block such that the first one or more dedicated lines connecting through the first logic and routing block, bypass the second logic and routing block, and connect through the third logic and routing block.

11. A programmable logic structure, comprising:
a first logic and routing block, comprising:
    a first dedicated logic cell;
    a second dedicated logic cell, coupled to the first dedicated logic cell; and
    first one or more dedicated lines extending through the first dedicated logic cell and the second dedicated logic cell;
wherein the first dedicated logic cell includes:
    a first function generator having an input for receiving an input signal and an output;
    a first multiplexer having a first input connected to the output of the first function generator, a second input connected to a first dedicated line, and an output connected to a next dedicated logic cell; and
    a second multiplexer having an input for connecting to the output of the first function generator, a second input for connecting to the first dedicated line, and an output connected to the logic and routing block.

12. A programmable logic structure, comprising:
first logic and routing block, comprising:
    a first dedicated logic cell;
    a second dedicated logic cell, coupled to the first dedicated logic cell; and
    first one or more dedicated lines extending through the first dedicated logic cell and the second dedicated logic cell;
wherein the first dedicated logic cell includes:
a first function generator having inputs for receiving a plurality of input signals and an output;
a second function generator having inputs for receiving the plurality of input signals and an output;

a third function generator having inputs for receiving the plurality of input signals;
a fourth function generator having inputs for receiving the plurality of input signals and an output; and
a 4:1 multiplexer having a first input connected to the output of the first function generator, a second input connected to the output of the second function generator, a third input connected to the output of the third function generator, a fourth input connected to the fourth function generator, a first select line feeding from a first dedicated line in the one or more dedicated lines, a second select line feeding from a second dedicated line in the one or more dedicated lines and an output, wherein the first and second select lines selecting from one of the four inputs in the 4:1 multiplexer for generating an output signal to the output.

13. A programmable logic structure, comprising:
a first logic and routing block, comprising:
a first dedicated logic cell;
a second dedicated logic cell, coupled to the first dedicated logic cell; and
first one or more dedicated lines extending through the first dedicated logic cell and the second dedicated logic cell;
wherein the first dedicated logic cell includes:
a first function generator having inputs for receiving a first set of input signals and an output;
a second function generator having inputs for receiving a second set of input signals and an output;
a first 2:1 multiplexer having a first input for connecting to the output of the first function generator, a second input for connecting to the output of the second function generator, a first select line feeding from a first dedicated line in the one or more dedicated lines, and an output;
a third function generator having inputs for receiving the first set of input signals and an output;
a fourth function generator having inputs for receiving the second set of input signals and an output; and
a second 2:1 multiplexer having a first input for connecting to the output of the third function generator, a second input for connecting to the output of the fourth function generator, the first select line feeding from a first dedicated line in the one or more dedicated lines connecting to both the first multiplexer and the second multiplexer such that the first and second multiplexers share the common select line.

14. A programmable logic structure, comprising:
a first logic and routing block, comprising:
a first dedicated logic cell;
a second dedicated logic cell, coupled to the first dedicated logic cell; and
first one or more dedicated lines extending through the first dedicated logic cell and the second dedicated logic cell;
wherein the first dedicated logic cell includes:
an 8:1 multiplexer having first inputs for receiving a first plurality of input signals, second inputs for receiving a second plurality of input signals, at least one dedicated line in the one more dedicated lines functioning as select line for the 8:1 multiplexer, and an output;
a multiplexer decode logic having inputs for receiving at least one dedicated line in the one or more dedicated lines and an output; and
a multiplexer chaining logic having a first input for connecting to the output of the 8:1 multiplexer, a second input, and a third input for connecting to the output of the multiplexer decode logic.

15. A method for programming a programming logic circuit, comprising: receiving a first set of dedicated lines in a first dedicated logic cell in a first logic and routing block; and
connecting the first set of dedicated lines beyond the first dedicated logic cell to a second location;
wherein the second location comprises a second logic and routing block that is non-contiguous to the first logic and routing block such that a second set of dedicated lines are stitched to the first set of dedicated lines for skipping over an adjacent logic and routing block to the second logic and routing block.

* * * * *